United States Patent [19]

Everett

[11] 4,289,367

[45] Sep. 15, 1981

[54] SPRING LOADED CONNECTOR PIN

[75] Inventor: Stephen M. Everett, Livermore, Calif.

[73] Assignee: John Fluke Mfg. Co., Inc., Mountlake Terrace, Wash.

[21] Appl. No.: 102,055

[22] Filed: Dec. 10, 1979

[51] Int. Cl.³ .............................................. H01R 4/48
[52] U.S. Cl. .............................. 339/64 R; 339/150 B; 339/255 R
[58] Field of Search ........... 339/31 T, 108 TP, 150 B, 339/151 B, 149 P, 255 R, 64 R; 324/158 P

[56] References Cited

U.S. PATENT DOCUMENTS 3,434,095  3/1969  De Rose ......................... 339/255 R

FOREIGN PATENT DOCUMENTS 2707900  8/1978  Fed. Rep. of Germany ... 324/158 P

OTHER PUBLICATIONS

IBM Technical Disclosure Bulletin; "Switching Probe", vol. 18, No. 8, Jan. 1976.

*Primary Examiner*—John McQuade
*Attorney, Agent, or Firm*—Townsend and Townsend

[57] ABSTRACT

An electrical contact assembly for electrically coupling a first contact location on a first side of a planar test fixture to a second contact location on the opposing side of the test fixture. A first tubular barrel is provided for fixably mounting through a test fixture. A second tubular barrel is mounted within said first barrel with one end disposed to extend toward said first contact location. The second tubular barrel is reciprocally movable within the first barrel between a first position extending toward said first contact location and a second position extending toward said second contact location. The second barrel is biased toward said first position. A plunger is mounted within said second tubular barrel with one end disposed to extend toward said second contact location. The plunger is reciprocally movable within said second barrel between a first position extending toward said second contact location and a second position extending toward said first contact location. The plunger is biased toward said first position extending toward said second contact location. The contact assembly acts to urge said plunger toward said second contact location in response to a force acting on the extended of the second tubular barrel. The plunger retracts relative to the second tubular barrel to compensate for overextension of the second tubular barrel relative to the second contact location. Bias is preferably provided by a compression spring mounted between stops of the first and second barrel and a compression spring mounted between stops of the second barrel and the plunger. An electrical path is established between the end of the plunger and the end of the second barrel.

5 Claims, 2 Drawing Figures

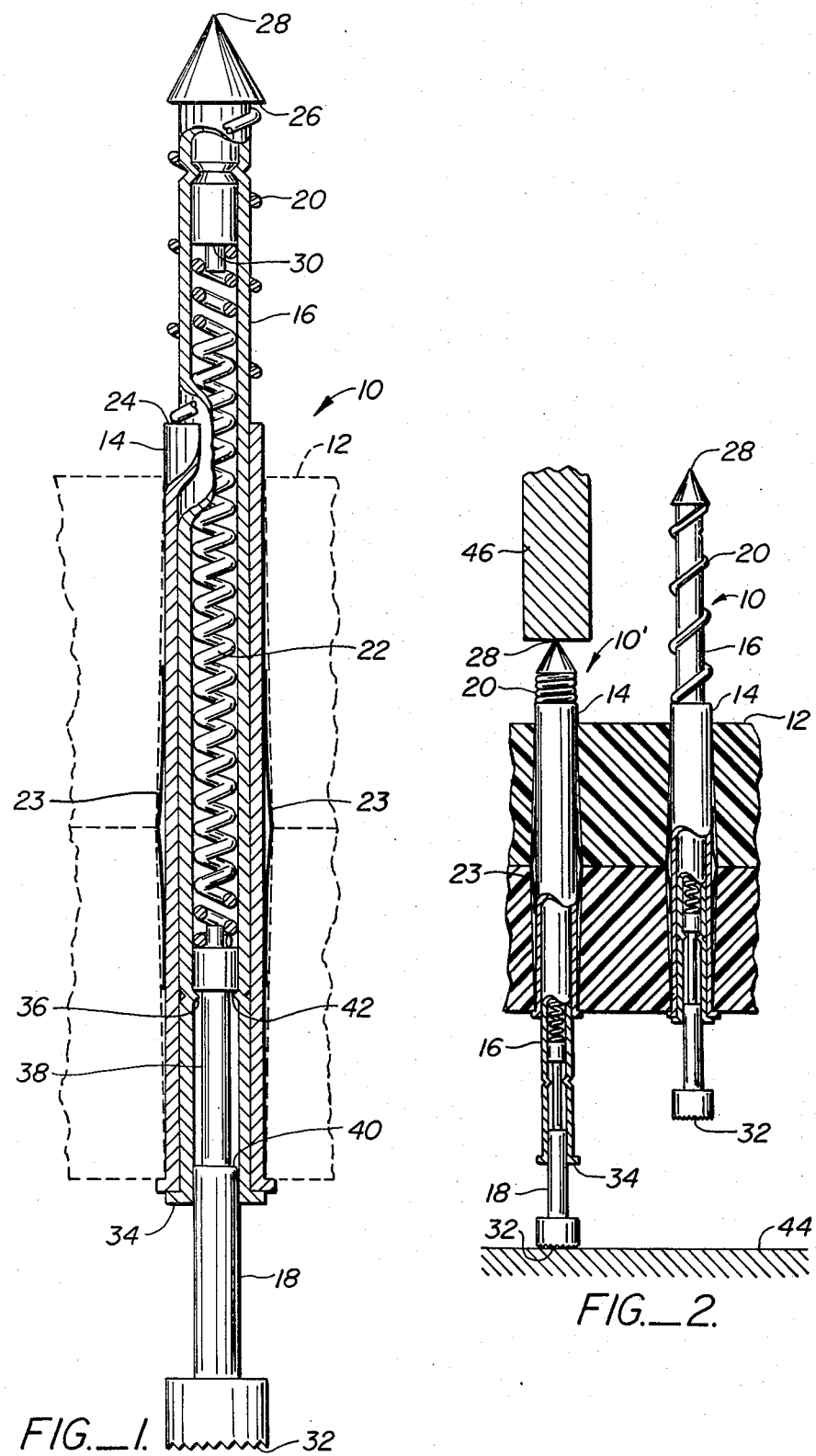

SPRING LOADED CONNECTOR PIN

BACKGROUND OF THE INVENTION

Field of Invention

This invention relates to contact assemblies, generally known as test probes, for use in the electronic industry in testing printed circuit boards, integrated circuits, terminal testing boards and the like. In a test application, the contacts are mounted in a test board arranged in the pattern of contact locations which is to be tested. When the contact assemblies mounted to the test board are brought into contact with the circuit pattern to be tested, each contact assembly is intended to collapse slightly to compensate for irregularities between the heights of adjacent contact locations.

It is frequently only necessary to test a few selected contact locations of a circuit. In the past, in such circumstances, it has nevertheless been necessary to effect contact with all intended contact locations of a test fixture designed to accommodate the circuit under test. Moreover, a serious disadvantage of known testing apparatus is the lack of a general purpose contact assembly usable with a wide variety of circuit layouts. What is therefore needed is a mechanism or device making it possible to provide test fixtures for general purpose circuit board test applications wherein only the specific test probes in use effect contact with the pattern to be tested.

SUMMARY OF THE INVENTION

According to the invention an electrical contact assembly is provided for coupling a first contact location on a first side of a planar text fixture to a second contact location on the opposing side of a text fixture. A first tubular barrel is provided for fixed mounting through a test fixture. A second tubular barrel is mounted within said first barrel with one end disposed to extend toward said first contact location. The second tubular barrel is reciprocally movable within the first barrel between a first position extending toward said first contact location and a second position extending toward said second contact location. The second barrel is biased toward said first position. A plunger is mounted within said second tubular barrel with one end disposed to extend toward said second contact location. The plunger is reciprocally movable within said second barrel between a first position extending toward said second contact location and a second position extending toward said first contact location. The plunger is biased toward said first position extending toward said second contact location. The contact assembly acts to urge said plunger toward said second contact location in response to a force acting on the extended end of the second tubular barrel. The plunger retracts relative to the second tubular barrel to compensate for overextension of the second tubular barrel relative to the second contact location. Bias is preferably provided by a compression spring mounted between stops of the first and second barrel and a compression spring mounted between stops of the second barrel and the plunger. An electrical path is established between the extended end of the plunger and the opposing extended end of the second barrel.

The electrical contact assembly according to the invention may be referred to as a floating connector pin, since the electrical contacts of the connector pin are able to float reciprocally with respect to the test fixture through which the connector pin may be mounted.

A particular advantage of the floating connector pin is its use in connection with a test fixture of universal design. A complete "bed of nails" matrix can be disposed in a position confronting a pattern to be tested. However, only those contact pins necessary to test the pattern need be extended to abut to contact locations. Other advantages and purposes of the invention will be apparent upon reference to the following detailed description of specific embodiments in connection with the accompanying drawings.

BRIEF DESCRIPTION OF THE DRAWINGS

FIG. 1 is a side cross-sectional view of an electrical contact assembly for floating test pin of the invention.

FIG. 2 is a side cross-sectional view of a test fixture and a portion of a circuit pattern to be tested showing contact pins in two different extension positions.

DETAILED DESCRIPTION OF SPECIFIC EMBODIMENTS

FIG. 1 shows a cross-sectional view of a contact assembly 10 according to the invention. The contact assembly is shown as mounted in a test fixture 12, typically a planar board having a tubular perforation therethrough. The contact assembly comprises a first element 14, a second element 16 and a third element 18, first biasing means 20 and second biasing means 22. In the specific embodiment shown, the first element 14 is a tubular barrel of larger diameter than the second element 16, also a tubular barrel. The first element 14 is mounted through the perforation of the test fixture 12 in a friction fit. For this purpose, a laterally compressible compression clip 23 may be provided on the outside of the body of the first element 14 which engages the walls of the perforation.

The second element 16 is mounted within the inside diameter of the first element 14 and is reciprocally movable between a first position and a second position, as illustrated in FIG. 2. The first biasing means 20 is a helical spring, having one end resting on a shoulder 24 at the end of the first element 14 and the outer end resting against a flange 26 of the second element 16, the flange 26 being adjacent an extended end 28 of the second element 16. The extended end 28 is an electrical contact. The first biasing means 20 is operative to bias the second element 16 relative to the first element 14 such that the extended end 28 extends a maximal distance from the first element 14.

The second biasing means 22 is also preferably a helical spring. It is mounted between any fixed stop of the second element 16, such as a plug 30 adjacent the end 28. The opposing end of the second biasing means 22 is mounted to the third element 18.

The third element 18 is preferably a plunger mounted for reciprocal movement within the inner diameter of the second element 16. The second biasing means 22 biases the third element 18 such that an extreme end 32 of the third element 18 is extended a maximal distance from the second element 16. The extreme end 32 is also an electrical contact. In the embodiment shown, the helical spring defining second biasing means 22 is an electrically conductive element coupling the contact of extreme end 32 through the plunger of third element 18 to the plug 30 to the electrical contact of end 28. Alternatively, electrical contact can be established by direct or friction contact between abutting surfaces of the third element 18 and the second element 16.

The contact assembly 10 includes stops defining the bias positions and extent of throw of the second element 16 relative to the third element 18 and the second element 16 relative to the first element 14. The second element 16, for example, includes a collar 34 at the second end thereof which abuts to the first element 14 in the rest position. Similarly, a ringed indentation 36 of the barrel of the second element 16 provides a stop for the third element 18. The third element 18 includes an annular recess 38 between its ends defining the extent of throw of the plunger of third element 18. The opposing shoulders 40, 42 of the recess encounter the identation 36 at the extremes of the throw.

Turning to FIG. 2, the operation of the invention is illustrated. The test fixture 12 to which a plurality of contact assemblies 10, 10' are mounted, is confronted to a circuit board 44 such that the contact assemblies 10, 10' align with selected contact locations. Rather than abutting the extreme ends 32 of the contact assembly to the circuit board 44 by urging the circuit board 44 to a closely adjacent position, however, test fixture 12 is fixed at a position spaced from the circuit board 44, and an actuating means 46 is urged into contact with the end 28 of selected ones of the assemblies 10'. The actuating means mechanically urges the second and third elements 16, 18 jointly toward the circuit board 44 until contact is established at the extreme end 32. Thereupon, the third element 18 is compressed, causing it to withdraw into the second element 16. Electrical contact is established between the conductive area on the circuit board 44 and a conductor in the actuating means 46.

In the meantime, adjacent contact assemblies 10 which have not been actuated remain spaced from the circuit board 44 so as not to interfere.

This invention has a wide variety of applications wherein specific circuit patterns can be actuated using a general purpose test fixture actuated by special purpose actuating means. Other applications, advantages and modifications of the invention will be apparent to those of ordinary skill in the art upon reference to this specification. It is therefore not intended that the invention be limited, except as indicated by the appended claims reasonably interpreted in light of this specification.

What is claimed is:

1. An electrical contact assembly for electrically coupling a first contact location disposed opposing a first side of a test fixture to a second contact location disposed opposing the opposing side of the test fixture for use in testing circuits on a printed circuit board, said contact assembly comprising a first element, a second element and a third element, and first biasing means and second biasing means, said first element being fixedly mounted to said test fixture, said second element being mounted to said first element and being reciprocally movable between a first primary position having an end extending a maximum distance from said first element and a second primary position, said second element being reciprocally movable with respect to said first element, said first biasing means being disposed to bias said second element toward said first primary position, said third element being mounted only to said second element, said third element being reciprocally movable between a first secondary position and a second secondary position, said third element having an end which in said first secondary position extends a maximum distance from said second element in said first primary position, said second biasing means being disposed to bias said third element relative to said second element toward said first secondary position, and wherein there is provided an electrical conductive path between said end of said second element and said end of said third element.

2. An assembly according to claim 1 wherein said first element is a tubular barrel, said second element is a tubular barrel mounted within said first element, and said third element is a plunger mounted within said second element.

3. An assembly according to claim 1 wherein, said first biasing means is operative to bias said second element relative to said first element and said second biasing means is operative to bias said third element relative to said second element and in a direction generally opposed to the biased direction of said second element relative to said first element.

4. An assembly according to claim 3 wherein said first and second biasing means comprise helical springs.

5. An assembly according to claim 4 wherein electrical contact between said ends of said second and third elements is effected through the helical spring comprising said second biasing means.

* * * * *